US010366920B2

(12) United States Patent
Briggs et al.

(10) Patent No.: US 10,366,920 B2
(45) Date of Patent: Jul. 30, 2019

(54) LOCATION-SPECIFIC LASER ANNEALING TO IMPROVE INTERCONNECT MICROSTRUCTURE (71) Applicant: International Business Machines Corporation, Armonk, NY (US)

(72) Inventors: Benjamin David Briggs, Waterford, NY (US); Lawrence A. Clevenger, Rhinebeck, NY (US); Bartlet H. Deprospo, Goshen, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 219 days.

(21) Appl. No.: 15/198,450

(22) Filed: Jun. 30, 2016

(65) Prior Publication Data
US 2018/0005883 A1 Jan. 4, 2018

(51) Int. Cl.
H01L 21/00 (2006.01)
H01L 21/768 (2006.01)
H01L 21/67 (2006.01)
H01L 21/66 (2006.01)
H01L 23/532 (2006.01)
(Continued)

(52) U.S. Cl.
CPC .... H01L 21/76894 (2013.01); B23K 26/0006 (2013.01); B23K 26/03 (2013.01); B23K 26/062 (2015.10); B23K 26/082 (2015.10); B23K 26/352 (2015.10); B23K 26/702 (2015.10); H01L 21/67115 (2013.01); H01L 22/26 (2013.01); H01L 23/53228 (2013.01)

(58) Field of Classification Search
CPC ........ H01L 21/67115; H01L 21/76894; H01L 22/26; H01L 23/53228; B23K 26/0006; B23K 26/0066; B23K 26/03; B23K 26/062; B23K 26/082; B23K 26/352; B23K 26/702
USPC .................................................. 438/5
See application file for complete search history.

(56) References Cited

U.S. PATENT DOCUMENTS 6,043,153 A 3/2000 Nogami et al.
6,103,624 A 8/2000 Nogami et al.
(Continued)

FOREIGN PATENT DOCUMENTS

KR 101493944 B1 * 2/2015

OTHER PUBLICATIONS

W. S, Yoo et al., "Pulsed Focused-Laser Beam Annealing of Ultra-Shallow Implanted Silicon and in Situ Dopant Activation Monitoring," International Conference on Solid State Devices and Materials, 2007, pp. 358-359.
(Continued)

Primary Examiner — Brook Kebede
(74) Attorney, Agent, or Firm — Vazken Alexanian; McGinn IP Law Group, PLLC (57) ABSTRACT A method (and structure) includes performing an initial partial anneal of a metal interconnect overburden layer for semiconductor devices being fabricated on a chip on a semiconductor wafer. Orientation of an early recrystallizing grain at a specific location on a top surface of the metal overburden layer is determined, as implemented and controlled by a processor on a computer. A determination is made whether the orientation of the early recrystallizing grain is desirable or undesirable.

12 Claims, 7 Drawing Sheets (51) Int. Cl.
   *B23K 26/082* (2014.01)
   *B23K 26/00* (2014.01)
   *B23K 26/03* (2006.01)
   *B23K 26/70* (2014.01)
   *B23K 26/062* (2014.01)
   *B23K 26/352* (2014.01)

(56) References Cited

U.S. PATENT DOCUMENTS

| | | |
|---|---|---|
| 6,514,840 B2 | 2/2003 | Barrett et al. |
| 6,835,657 B2 | 12/2004 | Ong |
| 7,399,359 B2 | 7/2008 | Im et al. |
| 7,507,667 B2 | 3/2009 | Yoo |
| 2005/0285269 A1* | 12/2005 | Cao ............... H01L 21/76877 257/758 |
| 2016/0086849 A1* | 3/2016 | Gluschenkov .... H01L 21/76834 438/662 |

OTHER PUBLICATIONS

H. Stegmann et al., "Transmission Electron Microscopy in Semiconductor Manufacturing," Science, Technology, and Education of Microscopy: An Overview, 2006, pp. 187-199.
D. Viladot et al., "Orientation and Phase Mapping in the Transmission Electron Microscope using Precession-Assisted Diffraction Spot Recognition: State-of-the-Art Results," Journal of Microscopy, vol. 252, No. 1, 2013, pp. 23-34.

* cited by examiner

LOCATION-SPECIFIC LASER ANNEALING TO IMPROVE INTERCONNECT MICROSTRUCTURE

BACKGROUND

The present invention relates to improving interconnect microstructure on semiconductor devices and, more specifically, to selective annealing using a focused laser of specific microscopic areas identified by any technique sensitive to crystal orientation that has the appropriate field of view, such as electron backscatter diffraction (EBSD), as used to map orientation of early-growth grains on the top surface of the device.

The present invention addresses the problem that fine grains having a wide variety of orientations exist on interconnects, leading to lower electromigration (EM) lifetimes and higher resistance values due to electron scattering than would result if grain orientations could be better controlled. Advanced metallization schemes involving higher melting point metals such as cobalt (Co), tungsten (W), Ruthenium (Ru), etc., are expected to struggle to achieve large grain microstructures, thereby again increasing resistance for interconnects. Electromigration is the process by which a metal conductor changes shape under the influence of an electric current flowing through it and which eventually leads to the breaking of the conductor.

Figure 1:
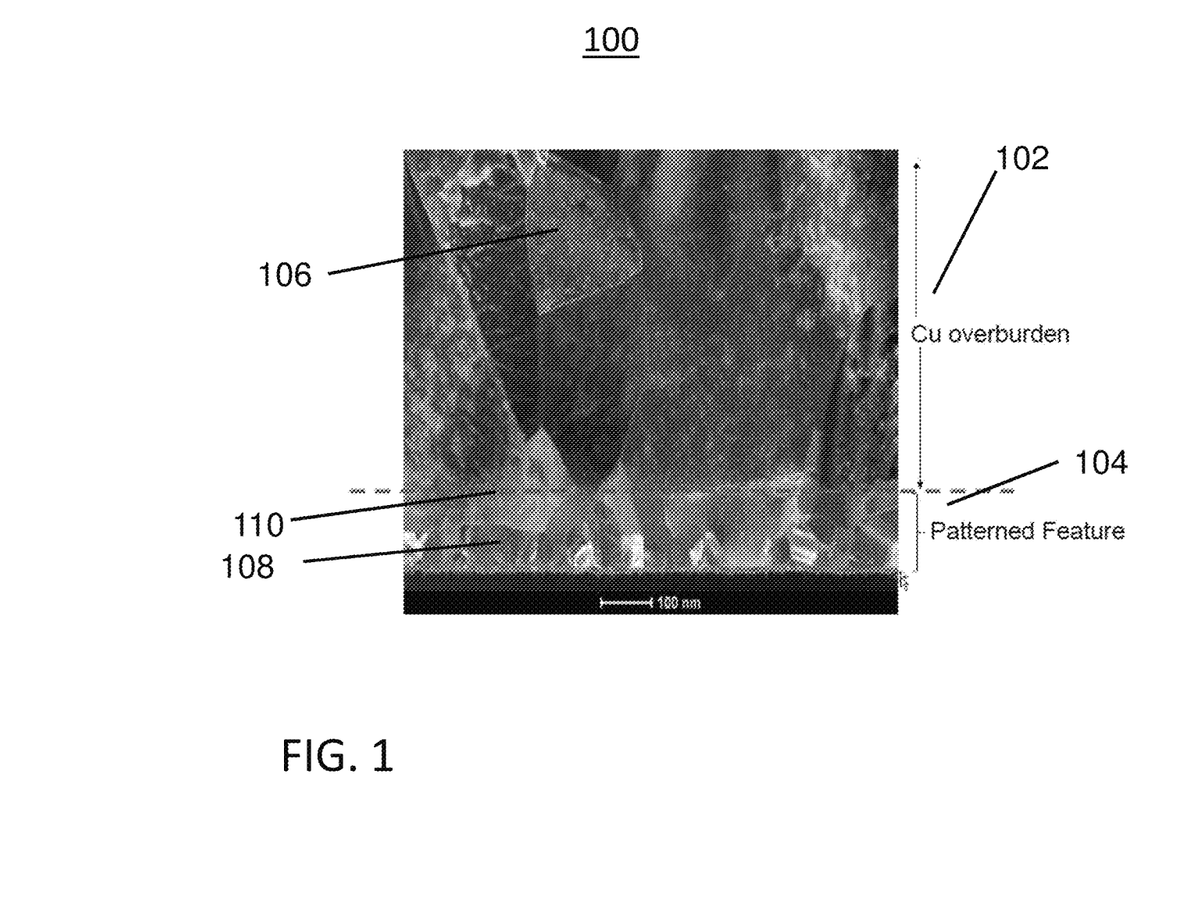
FIG. 1 illustrates a cross sectional view 100 of typical grain structures in patterned features underlying a Cu overburden.

Micrograph evaluations, such as exemplarily shown in FIG. 1, have demonstrated that copper (Cu) overburden 102 used as interconnects over patterned features 104 include large grains 106 that do not completely grow through to the underlying patterned features. Also, these evaluations further demonstrate that the pattern feature bottom surface contains more small grains 108 than its top surface 110. Prior art techniques have generally failed to improve grain structure of copper in narrow pitch features.

Although Cu is used in the following discussion to explain the problem identified by the present invention and the solution described herein, the present invention is intended as applicable for any metal used as an overburden to connect to underlying patterned features of a chip. Thus, the present invention addresses the problem of how to locally encourage preferred grain growth through the thickness of a thin film of metal to make optimal contact with an underlying feature.

SUMMARY

The method of the invention can be summarized as inciting an indication of early recrystallizing/growing grain orientations following an initial anneal of an overburden layer, detecting these orientations, and then selectively providing location-specific treatment so as to either promote or discourage specific grain orientations from growing at specific locations. The method can be used at any specific metallization level in the middle-of-line (MOL) or back-end-of-line (BEOL) where the method is required most, or on specific circuits with smallest dimensions or that require the highest reliability/lowest resistance.

These two terms, MOL and BEOL, are well known in the art, since semiconductor fabrication traditionally includes FEOL (Front-End-Of-the Line), MOL, and BEOL as describing the entire process flow for manufacturing computer chips. FEOL refers to the initial fabrication stages during which patterns are formed on the substrate. MOL refers primarily to gate formation. And BEOL refers to interconnecting the patterns and devices using up to twelve or more metallization layers each of which has its unique interconnect pattern.

The present invention thus provides a method to influence micro structural recrystallization at a grain level in trench features or any other desired metal surface for which desired localized grain characteristics would be beneficial to improve resistance and the reliability of chips.

DETAILED DESCRIPTION

Figure 2:
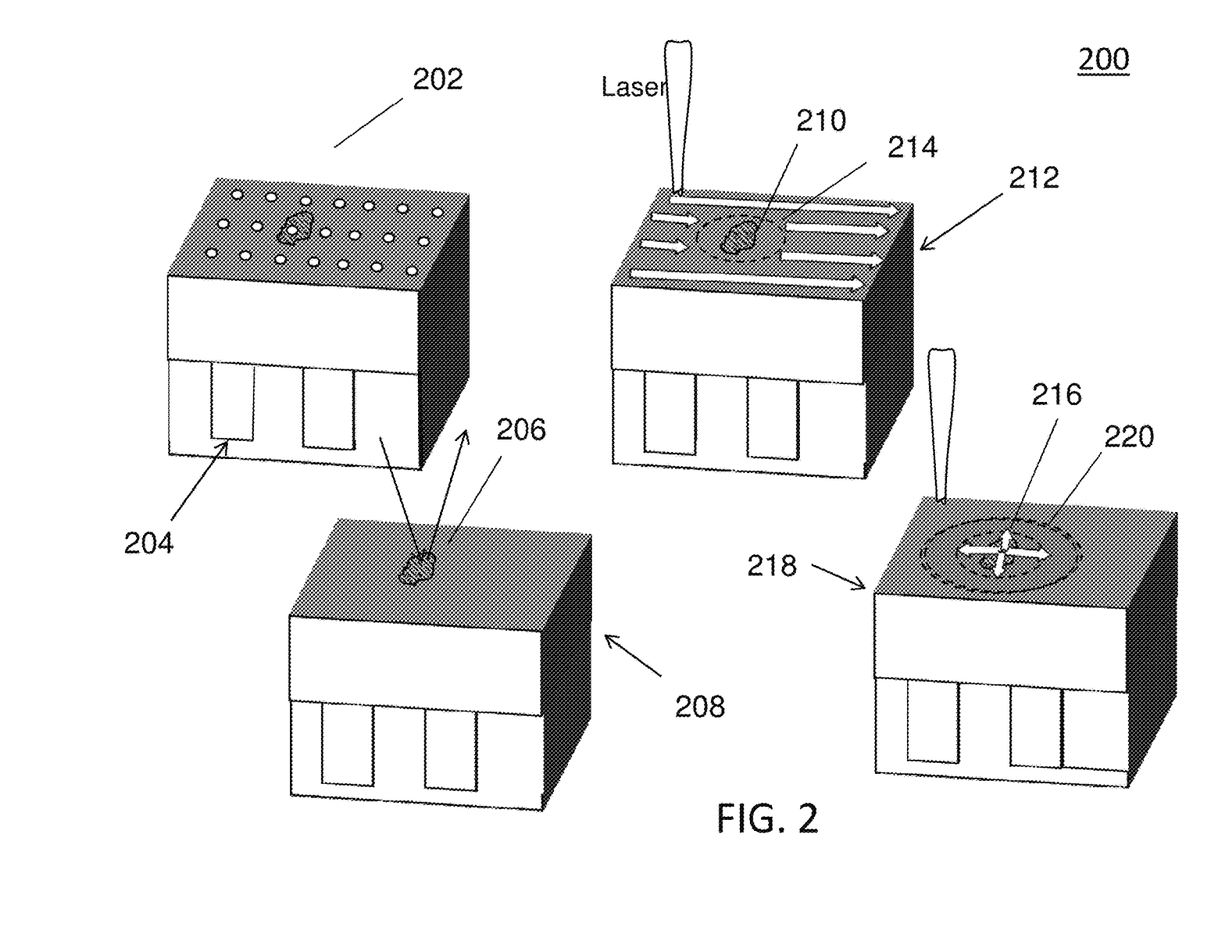
FIG. 2 illustrates pictorially the sequence 200 of the present invention.

With reference now to FIG. 2, the present invention provides a computerized method including a step in which the surface of an overburden 202, for example, Cu in current wafer processing technology, is discretely sampled (step 204) using, for example, the technique of electron backscatter diffraction (EBSD), typically by using a SEM (scanning electron microscope) equipped with an EBSD detector.

Discrete sampling is used in the present invention, since it is desired to systematically detect and evaluate grain development over a predetermined area of the overburden metal during its anneal. The sampling interval is based upon expected overburden grain size, which is dependent upon such parameters as overburden thickness and material. A typical sample interval for the discrete sampling might be 5 to 500 microns, depending upon the fidelity of data needed.

Although the present invention is explained using EBSD, other techniques such as X-ray diffraction could also be used for sampling of grain orientations that are becoming prevalent during recrystallization. The benefit of using EBSD is that it provides orientation detection at specific discrete points whereas X-ray diffraction is more general cannot currently provide location-specific information. However, as noted below, the localized laser anneal treatment of the present invention can also be used more generally than location-specific sites, so that X-ray diffraction might be used to detect a general tendency of early grain recrystallization in larger areas of the wafer.

The sample under evaluation has been partially thermally annealed at this stage, so that specific locations of interest 206 for orientations of early recrystallizing grains can be detected and highlighted (step 208) by the computer, for example, by storing in memory locations and diameters of grain recrystallization information or summary data of such grain information such as tendencies in specific regions under evaluation. Some of the detected early recrystallizing grains 206 may be desirable and some may be undesirable, depending upon their detected orientations.

The desired grain structure depends on various different parameters such as, for example, the metallization scheme and crystal system of the metal. For example, with face centered cubic (FCC) copper, a desired low-energy grain may have an orientation of 111 with respect to the wafer surface; therefore the laser anneal processing would be targeted to attempt to increase the prevalence of 111 grains over competing orientations. Other low-energy grains know as 'twins' could also be promoted by this technique. The term "low-energy grains" refers to the early grain recrystallization due to the partial anneal stage of the wafer. Twin boundaries are a special case of a large angle grain boundary for which there is no atomic misfit, so that it would be useful to encourage this type of grain convergence.

Thus, even though desirable/undesirable grain parameters may vary in different scenarios, as shown in FIG. 2, there are two alternative final annealment treatment mechanisms selectively available to be applied for each detected area of interest, one treatment for desirable grains and one treatment for undesirable grains.

Figure 3:
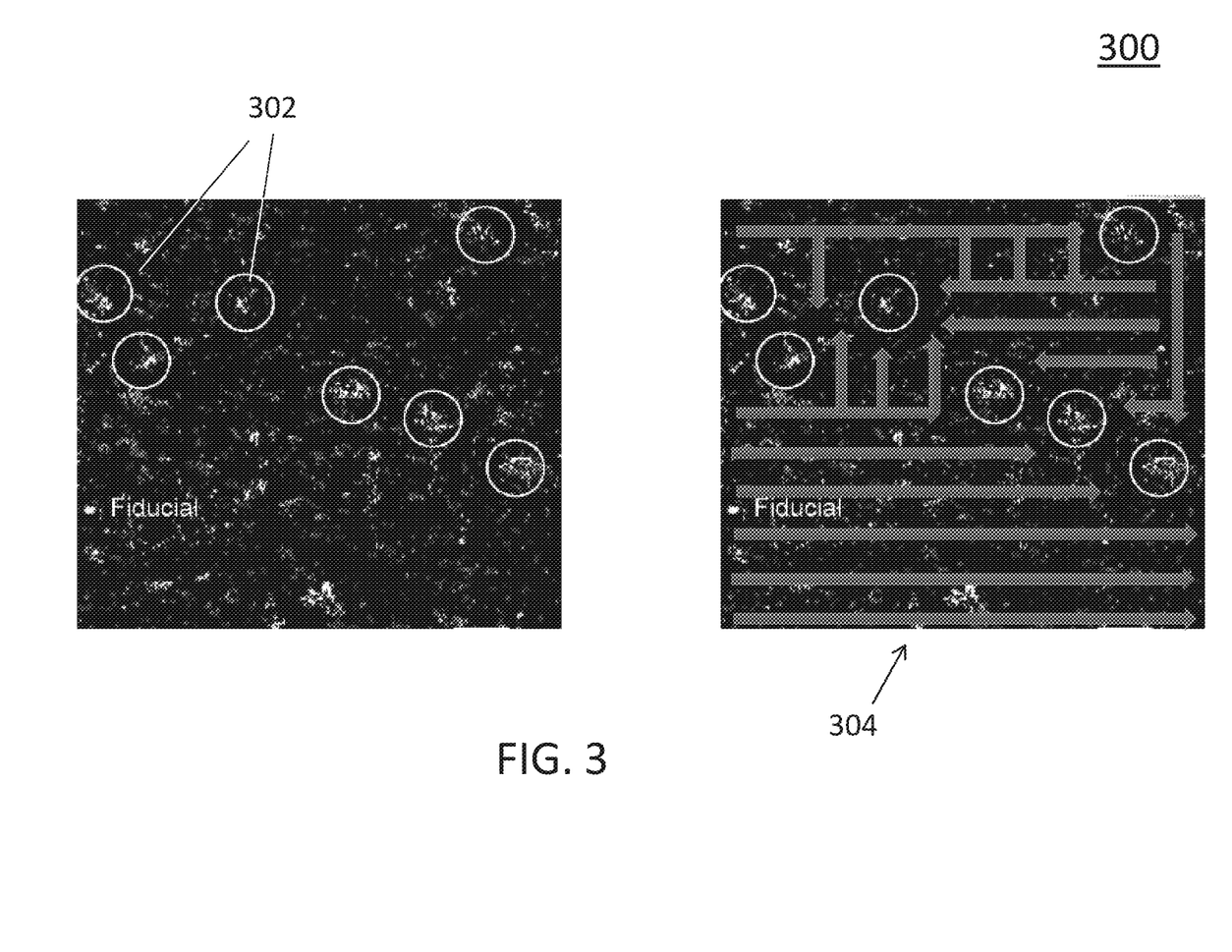
FIG. 3 illustrates exemplarily a sequence 300 of a portion of a wafer undergoing early grain recrystallization and localized laser anneal.

If the early recrystallizing grain 210 is undesirable, a laser is used, in the subsequent laser-anneal-completion, to implement an exclusion mode 212, in which the laser is moved in a raster pattern, at a speed and energy intended to anneal surrounding nanocrystalline Cu, while intentionally avoiding a "keep-out region" 214 near the undesired grain 210. In contrast, if the early recrystallizing grain 216 is desirable, the laser is used to implement an inclusion mode 218, in which the laser is moved in a raster pattern, for example, concentric circles of increasing diameter 220, to dwell on the initial large grain 216, to attempt to expand its boundary into the surround matrix FIG. 3 shows an example wafer portion 300 for which specific sites 302 have been identified as having undesirable early grain recrystallizations. Therefore, the present invention will highlight these sites 302 as circles for avoidance, so that the subsequent raster pattern 304 will apply localized anneal energy in a pattern that works around these identified circles of avoidance.

Figure 4:
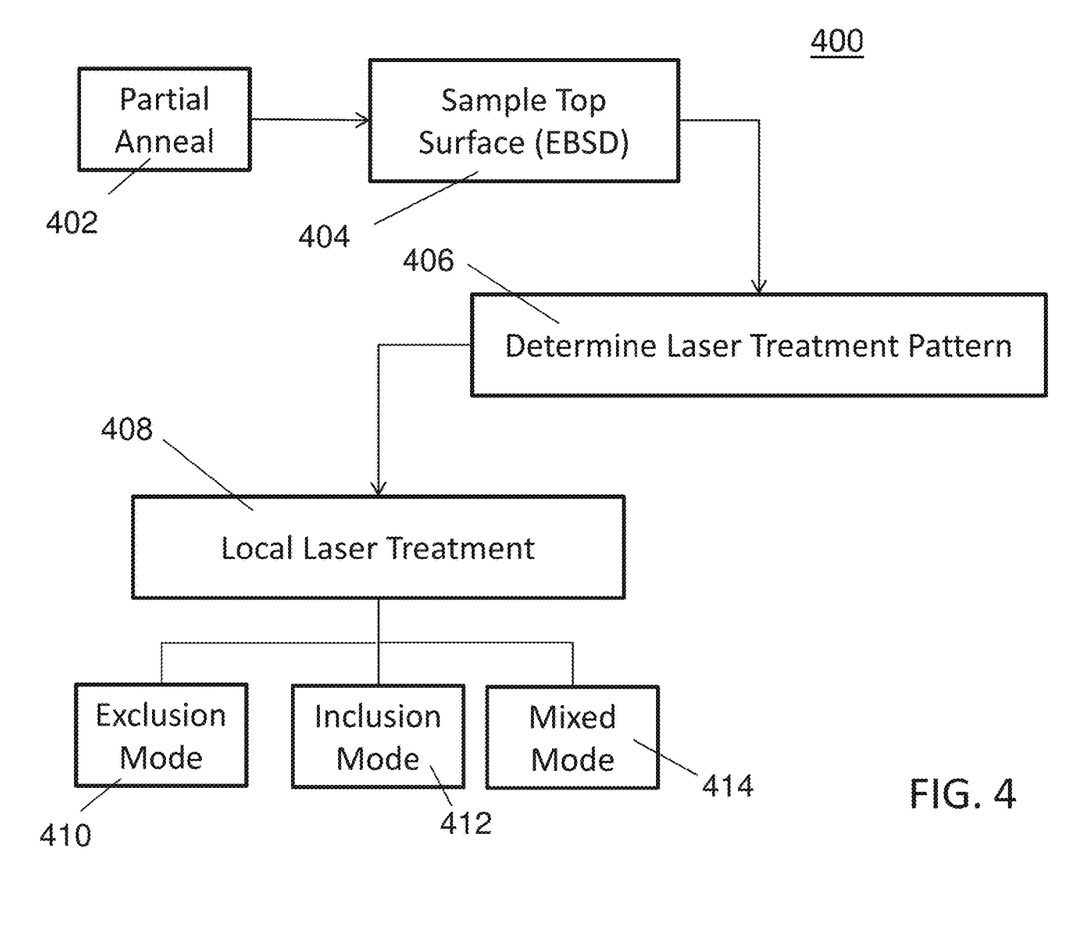
FIG. 4 illustrates processing steps 400 for an exemplary embodiment of the present invention.

FIG. 4 shows, in flowchart format 400, an exemplary embodiment of the invention. In step 402, a wafer containing devices to be treated by a partial thermal anneal intended to reveal early recrystallizing/growing grain orientations on the wafer surface. This initial partial thermal anneal can be achieved by a timed anneal, imparting a limited fluence (energy density) in a laser/rapid thermal anneal system or by monitoring wafer stress change during the initial anneal. Any anneal method can be used for this initial anneal, such as a furnace, hotplate, rapid thermal anneal (RTA), laser anneal, etc.

Relative to measurement of wafer stress, it is noted that a wafer bends during annealing due to the thermal expansion mismatch between the deposited layers and the wafer substrate. Thus, by detecting how much the wafer deflects, one can estimate the stress in the films by using Stoney's equation. Wafer deflection is typically measured in fabrication using a laser interferometer.

One version of Stoney's equation based on a plate system composed of a stress-bearing thin film of uniform thickness $h_f$, deposited on a relatively thick substrate, of uniform thickness $h_s$, is a simple relation between the curvature $\kappa$ of the system and the stress $\sigma^{(f)}$ of the film, as follows:

$$\sigma^{(f)} = \frac{E_s h_s^2 \kappa}{6 h_f (1 - v_s)}$$

where E is Young's modulus and v is Poisson's ratio. Stoney's equation is commonly used to infer film stress changes from experimental measurement of system curvature changes.

In step 404, the wafer is placed in a SEM equipped with an EBSD detector containing, for example, at least a phosphor screen, compact lens, and low light CCD camera. A typical EBSD system will have one of two different CCD cameras: one for fast measurements and one for slower, and more sensitive, measurements. The high-resolution detector has higher sensitivity and therefore the information within each diffraction pattern can be analyzed in more detail. EBSD systems are typical tools used in wafer fabrication and are resolutions and speeds are continually improving. Current EBSD systems can index patterns at up to 1800 patterns/sec, enabling very rapid and rich microstructural maps to be generated.

As well understood in the art, in an EBSD measurement, a flat/polished crystalline specimen, for example, a wafer under evaluation, is placed in the SEM chamber at a highly tilted angle (~70° from horizontal) towards the diffraction camera, to increase the contrast in the resultant electron backscatter diffraction pattern. The phosphor screen is located within the specimen chamber of the SEM at an angle approximately 90° to the pole piece and is coupled to a compact lens which focuses the image from the phosphor screen onto the CCD camera.

With this configuration, some electrons entering the sample will backscatter and may escape. Upon leaving the sample, these electrons may exit at the Bragg condition related to the spacing of the periodic atomic lattice planes of the crystalline structure and diffract, and some will collide and excite the phosphor causing it to fluoresce.

When the electron beam is focused onto the surface of the sample area (e.g., area of overburden metal), the electrons enter the sample and some may backscatter. Escaping electrons may exit near to the Bragg angle and diffract to form Kikuchi bands which correspond to each of the lattice diffracting crystal planes, from which diffraction pattern it is possible to relate to the underlying crystal phase and orientation of the material within the electron interaction volume. This crystal orientation relates the orientation of each sampled point to a reference crystal orientation.

In step 406, areas of interest resulting from the surface scan is retrieved from memory for determination of laser scanning patterns to be used for completion of the overburden metal. In step 408, a laser provides a computer-controlled, location-specific anneal to finish the anneal in a manner that either promotes or discourages specific grain orientations from growing. In the exclusion mode 410, directed to grains of unwanted orientation, an exclusion radius is set around a grain of an undesired orientation and the laser is rastered on the remainder of the sample around the exclusion radius so as to promote other orientations. In the inclusion mode 412, directed to grains having a desired orientation, the laser is moved in a raster pattern over the grain in order to preferentially expand the desired grain boundary into unrecryallized regions. In the mixed mode 414, unwanted grains are excluded, desired grains are promoted, and a background fluence is used for regions not near the desired grains. The background fluence is determined empirically, where the fluence condition is set when the grain structure is most desirable.

Concerning the laser treatment for completing the anneal, a laser beam can be focused in a manner so that its spot size would be able to anneal an individual grain. For example, a diode pumped, continuous wave (CW) yttrium aluminum garnet (YAG) laser beam at 1064 nm can be focused and optically modulated to deliver a high intensity, pulsed beam. The pulse width and repetition rate can be varied from 5 to 10 nsec and from 20 to 40 kHz, with a spot size on the order of tens of micrometers, which is more than sufficient for purpose of the present invention, and smaller wavelengths, such as approximately 300 nm, would provide correspondingly smaller spot sizes.

Figure 5:
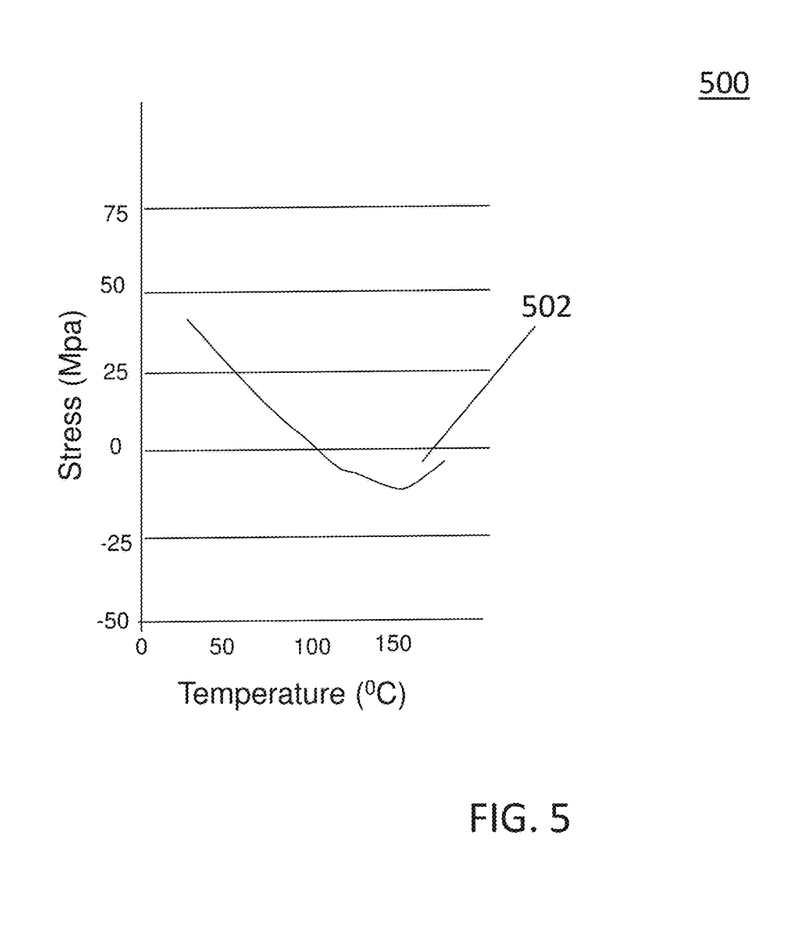
FIG. 5 illustrates an exemplary method 500 for monitoring of the initial partial anneal.

FIG. 5 shows how the initial partial anneal (see step 402, FIG. 4) could be implemented by monitoring the stress state of the metal layer during heating, where a stress "bump" 504 is observed when the microstructure begins to show significant grain growth. As previously noted, stress can be measured by using laser interferometer to detect wafer deflection and applying Stoney's equation.

Exemplary Hardware Aspects

Figure 6:
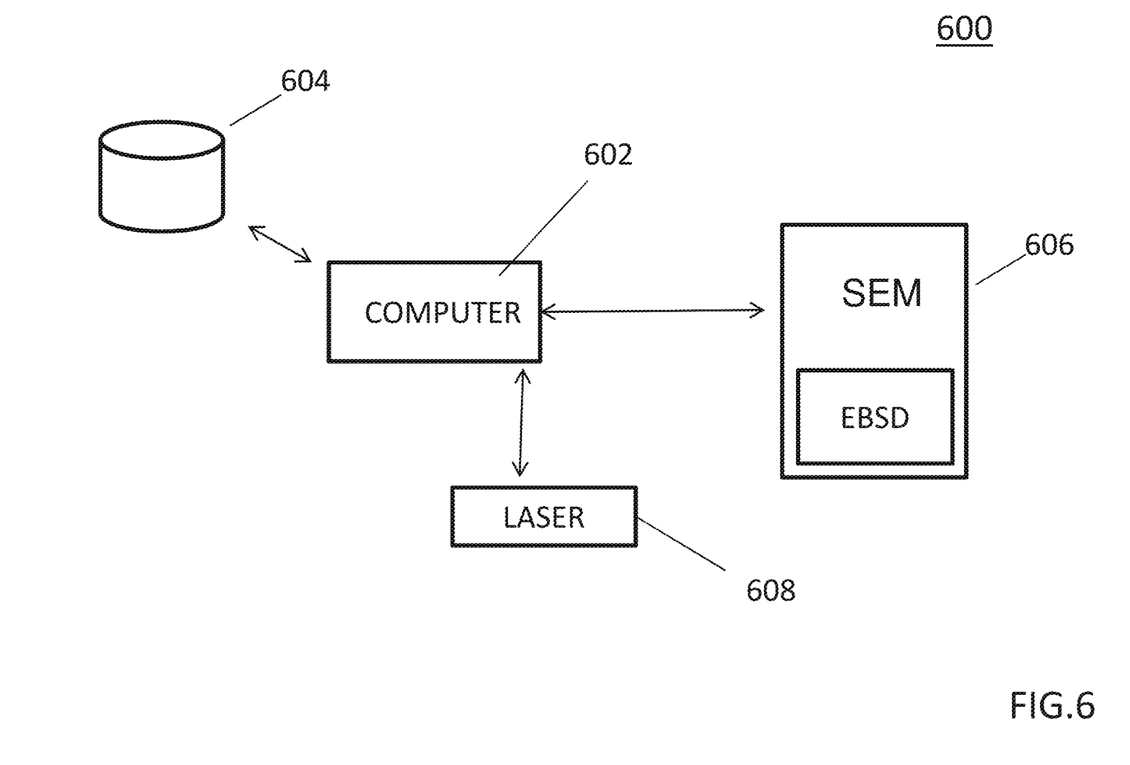
FIG. 6 illustrates, in block diagram format 600, a system for implementing the present invention.

FIG. 6 shows in block diagram format 600 a system for implementing the present invention. Because of the small dimensions involved, the present invention is necessarily computer-based. Therefore, computer 602 is used to execute an application program that controls the EBSD discrete sampling of a wafer under evaluation. Memory 604, which might be integral to the computer 602, is used to store the application program instructions, as well as the data obtained during the discrete sampling processing. Scanning electron microscope (SEM) 606, equipped with EBSD capability, is controlled by the computer 602 to implement the discrete sampling processing. Laser 608 is controlled by the computer 602 to implement the final anneal of the metal layer, based on the raster pattern determined by the application program to be optimal for desired recrystallization over the wafer.

Figure 7:
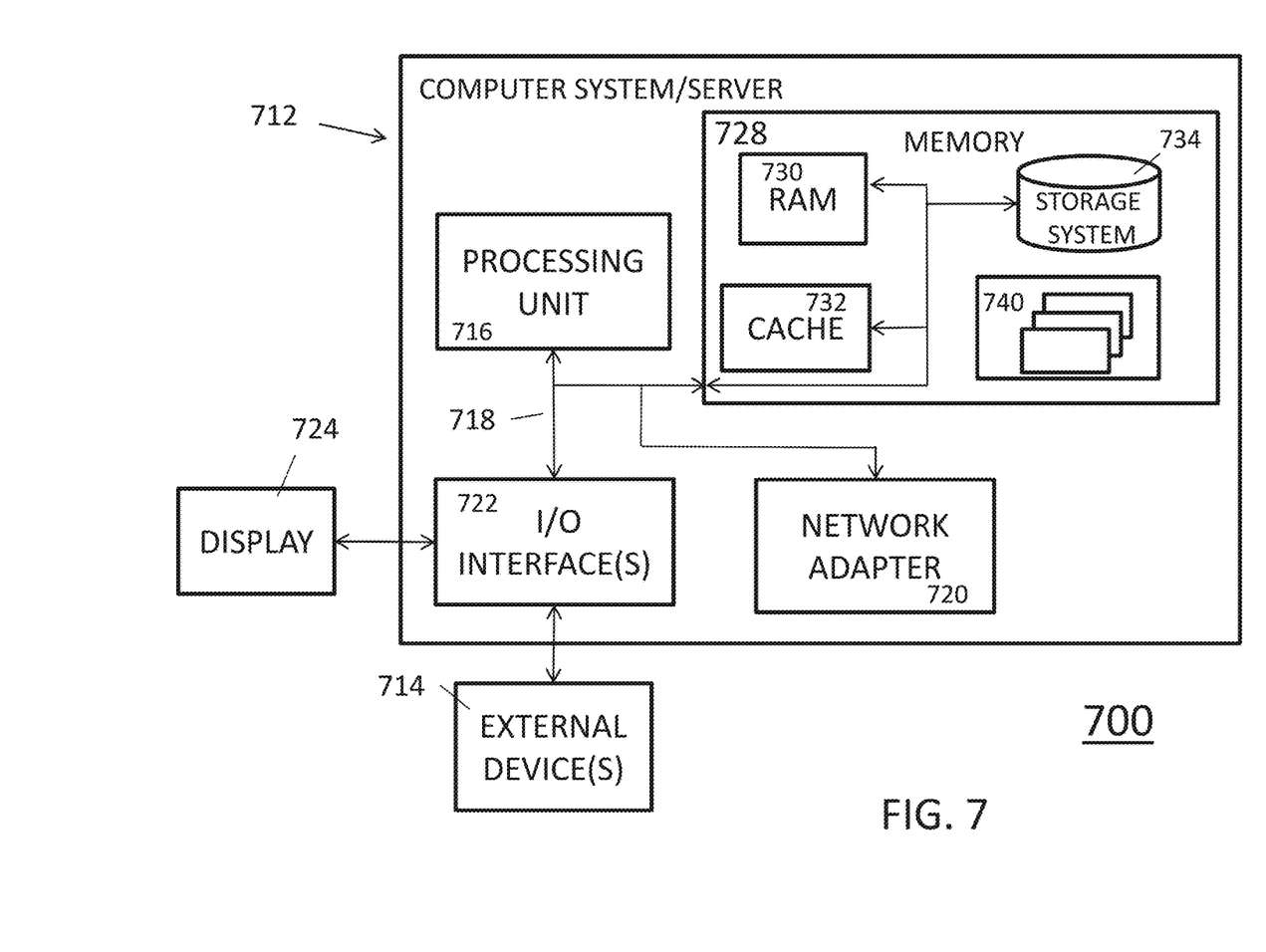
FIG. 7 illustrates an exemplary computer configuration that might be used to implement the present invention.

FIG. 7 illustrates a typical hardware configuration 700 of a computer system 712 in accordance with the invention and which has at least one processor or central processing unit (CPU) 716.

The CPUs 716 are interconnected via a system bus 718 to a hierarchical memory system 728 including a cache 723, random access memory (RAM) 730, read-only memory (ROM) 740, and disk storage 734. The system bus 718 is also connected to input/output (I/O) adapter 722, for connecting to display 724 and external devices 714, and to network adapter 720.

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of non-transitory storage media.

Thus, this aspect of the present invention is directed to a programmed product, comprising non-transitory storage media tangibly embodying a program of machine-readable instructions executable by a digital data processor incorporating the CPU 716 and hardware above, to perform the method of the invention.

This non-transitory storage media may include, for example, a RAM 728, as represented by the fast-access storage, for example. Alternatively, the instructions may be contained in another non-transitory storage media, such as a magnetic or optical data storage diskette directly or indirectly accessible by the CPU 716.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method, comprising: performing an initial partial anneal of a metal interconnect and overburden layer for semiconductor devices being fabricated on a chip on a semiconductor wafer; receiving image data of a top surface of the metal interconnect and overburden layer as image data from a scanning electron microscope (SEM) equipped with electron backscatter diffraction (EBSD); detecting an orientation of an early recrystallizing grain at a specific location on the top surface of the metal overburden layer, as implemented and controlled by a processor on a computer, in a process of selectively stepping through the image data at a preset sampling interval predetermined as based on an expected overburden grain size; determining whether the detected orientation of the early recrystallizing grain is desirable or undesirable; and selectively performing a laser anneal at specific locations to at least one of promote or inhibit certain grain orientations from growing, as based on the determining of being desirable or undesirable.

2. The method of claim 1, wherein said metal overburden layer comprises copper (Cu).

3. The method of claim 1, wherein said specific location comprises a point of a plurality of points of a discrete sampling grid of said top surface, said discrete sampling grid having a sample interval based on an expected overburden grain size.

4. The method of claim 3, wherein said discrete sampling grid is selectively applied to at least one of different regions and different layers of a chip during fabrication of a semiconductor wafer.

5. The method of claim 1, further comprising:
monitoring said initial partial anneal by using a laser interferometer to measure a flexure of said wafer; and
determining, from measurements of said wafer flexure, when to terminate said initial partial anneal in order to implement said detecting and determining of early grain recrystallization orientation.

6. The method of method 1, further comprising highlighting an area around an early recrystallizing grain that is determined as having a grain orientation that is of interest.

7. The method of claim 1, further comprising determining a raster pattern for a subsequent laser anneal that will complete an annealing of said metal interconnect overburden layer, based on said determining whether said orientation of said grain is desirable or is undesirable.

8. The method of claim 7, further comprising using said processor to control one or more of a focus, an energy level, and a projection location on said wafer of a laser beam, to follow said determined raster pattern.

9. The method of claim 8, wherein said raster pattern comprises one or more of:
an inclusion mode pattern of straight lines over a specific grain to impart heat energy to encourage crystallization at said specific grain;
an exclusion mode pattern avoiding a specific grain having an undesirable orientation while providing energy to promote other orientations on a remainder of a sample around an exclusion radius of said specific grain; and a mixed pattern in which grains with undesired orientations are avoided, grains with desired orientations are promoted, and regions not near desired grains receive a background fluence level.

10. A method of annealing a metal interconnect overburden layer, said method comprising: performing an initial partial anneal of said metal interconnect overburden layer for semiconductor devices being fabricated on a chip on a semiconductor wafer; determining an orientation of early recrystallizing grains at specific locations on a top surface of the metal overburden layer, as implemented and controlled by a processor on a computer; determining whether said orientations of the early recrystallizing grains at said specific locations is desirable or undesirable; selectively performing a laser anneal of said metal interconnect overburden layer, as implemented and controlled by said processor on said computer, in a manner that selectively promotes or inhibits grain orientations from growing at selective locations on said metal interconnect overburden layer; and determining points of a discrete sampling grid of said top surface, said discrete sampling grid having a sample interval based on an expected overburden grain size, said determined discrete sampling grid points comprising said specific locations on said top surface being sampled for said determining of grain orientation.

11. The method of claim 10, further comprising further comprising:
monitoring said initial partial anneal by using a laser interferometer to measure a flexure of said wafer; and
determining, from measurements of said wafer flexure, when to remove said wafer from said initial partial anneal for said determining of early grain recrystallization orientation.

12. The method of claim 10, wherein said determining of orientation comprises evaluation of grain orientation using a scanning electron microscope (SEM) equipped with electron backscatter diffraction (EBSD).

* * * * *